(12) United States Patent
Mukherjee et al.

(10) Patent No.: US 7,968,457 B2
(45) Date of Patent: Jun. 28, 2011

(54) SANDWICHED METAL STRUCTURE SILICIDATION FOR ENHANCED CONTACT

(75) Inventors: Niloy Mukherjee, Beaverton, OR (US);
Matthew V. Metz, Portland, OR (US);
Willy Rachmady, Beaverton, OR (US);
Gilbert Dewey, Hillsboro, OR (US);
Jack Kavalieros, Portland, OR (US);
Robert S. Chau, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 142 days.

(21) Appl. No.: 12/229,881

(22) Filed: Aug. 26, 2008

(65) Prior Publication Data

US 2010/0052166 A1  Mar. 4, 2010

(51) Int. Cl.
*H01L 21/44* (2006.01)
*H01L 21/3205* (2006.01)
*H01L 21/4763* (2006.01)

(52) U.S. Cl. ......... 438/655; 438/682; 438/664; 438/592

(58) Field of Classification Search .................. 257/774, 257/621, 622, 382, E21.259, 775; 438/650, 438/686, 682, 620, 592, 630, 649, 661, 665, 438/663, 664, 721, 755, 581, 583, 651, 655, 438/639, 627, 638, 741
See application file for complete search history.

(56) References Cited

U.S. PATENT DOCUMENTS

| | | | |
|---|---|---|---|
| 5,624,870 A * | 4/1997 | Chien et al. | 438/653 |
| 5,838,051 A * | 11/1998 | Yen et al. | 257/412 |
| 6,404,058 B1 * | 6/2002 | Taguwa | 257/770 |
| 6,690,093 B2 * | 2/2004 | Ahn et al. | 257/774 |
| 2005/0287799 A1 * | 12/2005 | Lee et al. | 438/648 |
| 2007/0141798 A1 | 6/2007 | Bohr | |
| 2007/0231984 A1 | 10/2007 | Metz | |
| 2008/0230845 A1 * | 9/2008 | Okonogi et al. | 257/382 |

* cited by examiner

*Primary Examiner* — Chuong A. Luu
(74) *Attorney, Agent, or Firm* — Scott M. Lane

(57) ABSTRACT

Embodiments of an apparatus and methods for forming enhanced contacts using sandwiched metal structures are generally described herein. Other embodiments may be described and claimed.

6 Claims, 4 Drawing Sheets

SANDWICHED METAL STRUCTURE SILICIDATION FOR ENHANCED CONTACT

FIELD OF THE INVENTION

The field of invention relates generally to the field of semiconductor integrated circuit manufacturing and, more specifically but not exclusively, relates to CMOS (complementary metal oxide semiconductor) devices with silicidation formed using sandwiched metal structures to provide enhanced contacts.

BACKGROUND INFORMATION

The fabrication of microelectronic devices involves forming electronic components on microelectronic substrates, such as silicon wafers. These electronic components may include transistors, resistors, capacitors, and the like, with intermediate and overlying metallization patterns at varying levels, separated by dielectric materials, which interconnect the electrical components to form integrated circuits.

Metal-oxide-semiconductor (MOS) transistors, such as MOS field effect transistors (MOSFET), are commonly used in the fabrication of microelectronic devices. Generally, three electrical contacts are made to each MOS transistor. Two contacts are made to two contact regions (i.e., one to a source region and one to a drain region) and one contact is made to the gate stack. As semiconductor nodes are scaled down to the 45 nm level and beyond, the transistors and contacts become increasingly smaller and the electrical resistance inherent to standard silicide contact structures increases to unacceptable levels.

Accordingly, improved electrical contacts are needed for small scale MOS transistors, such as transistors used in 45 nm nodes, as well as methods for manufacturing such improved electrical contacts.

BRIEF DESCRIPTION OF THE DRAWINGS

The present invention is illustrated by way of example and not as a limitation in the figures of the accompanying drawings, in which.

DETAILED DESCRIPTION

An apparatus and methods for forming enhanced contacts using sandwiched metal structures are described in various embodiments. In the following description numerous specific details are set forth, such as a description of an apparatus and method to increase the surface area between a contact and a silicide formed using a sandwiched metal structure. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

It would be an advance in the art to reduce contact resistance in the fabrication of a microelectronic device, particularly those devices with contact regions positioned in a densely packed topography with very small geometries. Reducing the contact resistance in semiconductor devices using an enhanced contact may reduce power consumption and related heat generation while providing the user with increased battery lifetime and increased performance. A reduction in contact resistance is one benefit to increasing an effective contact area between a contact and a conductor fabricated, in one embodiment, using a stack of layers with a conductive layer sandwiched between two semiconductor layers and thermally treating the stack of layers to form a silicide on at least a remaining portion of one of the semiconductor layers. Use of dedicated semiconducting layers in the formation of a silicide avoids or substantially reduces an amount of donor material that would otherwise be consumed from a contact region. Further, formation of the enhanced contact enables use of trench structures to separate attributes of a device, such as a source, drain, and gate of a transistor to enhance manufacturability and device yield.

One such method for forming an enhanced contact may comprise depositing a field layer on a contact region. The field layer is patterned to expose the contact region through an opening, wherein the opening has at least one sidewall. A base layer comprising an intrinsic or doped semiconductor is formed on the contact region and at least a portion of the sidewall. A conductive layer is deposited on the base layer and a top layer comprising an intrinsic or doped semiconductor is formed adjacent to the conductive layer. The base layer, the conductive layer, and the top layer is thermally treated to form a silicide layer on at least a portion of the sidewall and base layer to provide a conductive path to the contact region.

Figure 1:
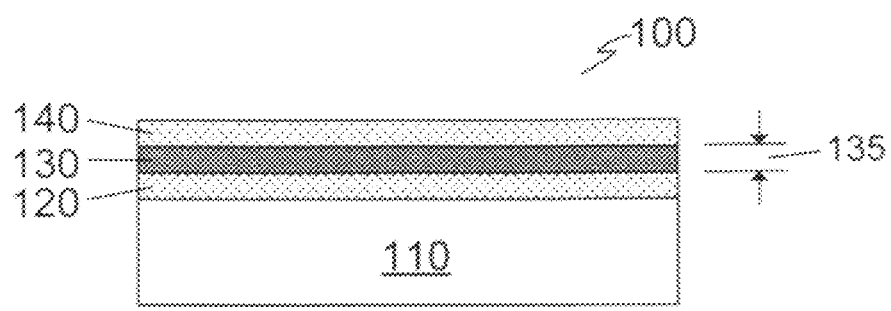
FIG. 1 is an illustration of a cross-sectional view of a device with a conductive layer deposited between two semiconductor layers.

Turning now to the figures, FIG. 1 is an illustration of a cross-sectional view of a sandwiched metal structure 100 on a substrate 110 with a conductive layer 130 positioned between a base layer 120 and a top layer 140. The substrate 110 may comprise doped and/or undoped silicon (Si), germanium (Ge), silicon germanium (SiGe), gallium arsenide (GaAs), indium antimonide (InSb) in monocrystalline form, a ceramic or other material suitable for supporting the sandwiched metal stack 100. The substrate 110 may further comprise one or more buried layers such as a silicon-on-insulator (SOI) layer.

The base 120 may be formed directly on the substrate 110 as shown in FIG. 1, or it may be formed on another surface, such an intermediate layer (not shown). In one embodiment, the substrate 110 is a monocrystalline substrate and the base layer 120 is formed using the substrate 110 as a seed, resulting in the base layer 120 with the same or substantially the same lattice structure and orientation as the substrate 110. In this embodiment, the base layer 120 may be formed of a semiconductor material using one or more gaseous and/or liquid precursors with a vapor-phase epitaxy, molecular beam epitaxy, or a liquid-phase epitaxy process. In another embodiment, the base layer 120 is a polycrystalline or an amorphous layer formed one or more processes such as a chemical vapor deposition process (CVD), a physical vapor deposition process (PVD), an atomic layer deposition process (ALD), a gas cluster ion beam process (GCIB), or another thin film deposition technique. The base layer 120 may be formed in an intrinsic undoped or doped condition when formed or alternately, may be formed in an undoped condition and later doped using an ion implantation, GCIB, or a diffusion process.

The conductive layer 130 may be deposited using a CVD, PVD, ALD, an electroplating process, an electroless plating process, or another process for depositing a conductive layer known to one skilled in the art. In one embodiment, the conductive layer 130 is formed from a conductive material such as a transition metal, a rare earth metal, an alkali metal, or an alkaline earth metal that is capable of forming a stable silicide compound when combined with silicon, a germanide compound when combined with germanium, or a silicide/germanide compound when combined with SiGe. In one embodiment, the conductive layer 130 may be tungsten (W), titanium (Ti), tantalum (Ta), cobalt (Co), nickel (Ni), platinum (Pt), palladium (Pd), or alloys thereof, though the embodiment is not so limited. A thickness of the conductive layer is selectively designed to allow the conductive layer 130 to be consumed during a thermal treatment or anneal process by the base layer 120 and/or the top layer 140.

The top layer 140 may be formed using the same process or processes used to form the base layer 120. Alternately, the sacrificial layer 140 may be formed using an alternate CVD, PVD, ALD, epitaxial, GCIB, or another thin film deposition technique.

Figure 2:
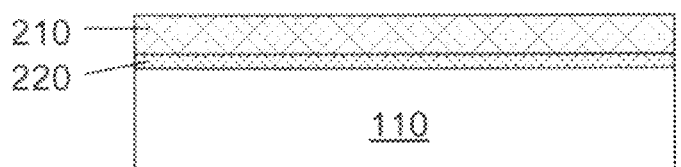
FIG. 2 illustrates the device in FIG. 1 after treating the device with a silicidation process.

FIG. 2 illustrates the device in FIG. 1 after treating the sandwiched metal stack 100 with an anneal process. The anneal process is performed to cause the base layer 120, the conductive layer 130, and the top layer 140 to react and form a silicide layer 210, herein defined as a silicide compound when combined with silicon, a germanide compound when combined with germanium, or a silicide/germanide compound when combined with SiGe. The silicide layer 210 may also be referred to as a salicide, as the silicide layer 210 may be formed using a self-aligned process without the need for a lithographic patterning process. One benefit to forming the silicide layer 210 using a base layer 120 and a top layer 140 over a conductive layer 130 is that providing contributing layers above and/or below the conductive layer 130 will greatly enhance the kinetics of the silicidation process, while enabling more complete silicidation (lower intrinsic phase resistivity) and a more thermodynamically stable silicide without extensive modulation of annealing temperature and time. Another benefit is that semiconducting material is provided to form the silicide layer 120 without contributing any or a substantial amount of material from the substrate 110. As a result, the silicide layer 210 may be formed at a lower silicidation temperature than would otherwise be necessary using traditional methods.

Formation of the silicide layer 210 results in an interface layer 220 between the silicide layer 210 and an adjacent surface, such as the substrate 110 of FIG. 2. In one embodiment, the interface layer 220 is a remaining portion of the base layer 120 that does not react to form the silicide layer 210, or compound, with the conductive layer 130 and the top layer 140.

Figure 3:
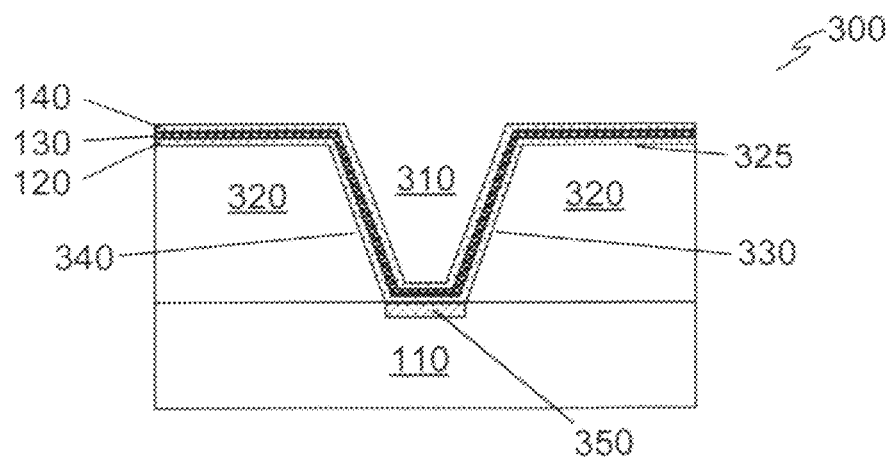
FIG. 3 is an illustration of a cross-sectional view of a device with a sandwiched metal structure on a trench contact network.

FIG. 3 is an illustration of a cross-sectional view of a portion of a trench contact network (TCN) 300 with the conductive layer 130 deposited between the base layer 120 and the top layer 140 over an opening 310 formed in a field layer 320 and an upper surface 325 of the field layer 320. In this embodiment, the opening 310 has a first sidewall 330, a second sidewall 340, and a surface of a contact region 350. The contact region 350 is exposed by eroding or etching the field layer 320 to form angled sidewalls, the first sidewall 330 and the second sidewall 340. The TCN comprises a plurality of trenches that may have sharp corners as illustrated in FIG. 3, or with rounded corners (not shown), connected to and through higher level interconnects to provide desired functionality. Trenches may be roughly rectangular in shape when viewed from the top whereas vias may be roughly circular in shape when viewed from the top.

In a further embodiment (not shown), the opening 310 is formed with a first sidewall 330 and a second sidewall 340 with one or both sidewalls formed vertically or substantially vertical to provide a right angle or nearly right angle between the substrate 110 and the first sidewall 330 and/or second sidewall 340. In another embodiment (also not shown), the opening 310 is a via, which may be part of a via contact network (VCN), that is formed by etching holes through the field layer 320. In an embodiment where ALD is used to obtain conformal deposition on surfaces of the TCN and/or VCN, the vapors associated with ALD are not charge driven from a source and therefore are not deposited just on the "line of sight" from a source. Rather, they form on all regions, independently of orientation thereby providing an entirely uniform layer, even on overhangs and other downwardly facing facets as well as on vertical surfaces (not shown in this embodiment).

The field layer 320 may be an oxide layer, a nitride layer, an oxynitride layer, a high-K layer, or another material commonly used in the manufacture of semiconductor devices. The contact region 350 is illustrated in FIG. 3 on a substrate 110, but the embodiment is not so limited. Alternately, the contact region 350 may be a conductive material such as a metal layer, a doped or undoped polysilicon layer, amorphous layer, or epitaxial layer.

In one embodiment, a conductive layer thickness 135 of the conductive layer 130 ranges approximately between 50 to 400 angstroms (Å). A thickness of the base layer 120 and the top layer 140 may range approximately between 50 to 300 Å or more preferably approximately between 50 to 200 Å. The base layer 120 may be thicker than the top layer 140 in an embodiment. For example, the base layer 120 may generally be between 1.5 to 2.5 times the thickness of the top layer 140. So, in one example, if the top layer 140 is 100 Å the base layer 120 may approximately be 200 Å. Alternately, the base layer 120 may be approximately the same thickness or thinner than the top layer 140. Also, the base layer 120 and/or the top layer 140 may be intrinsic or selectively doped with one or more dopants such as Phosphorus (P), Arsenic (As), Antimony (Sb), Boron (B), Gallium (Ga), Indium (In), or other materials known to one skilled in the art to a concentration of approximately 5E21 to 5E22 atoms/cm^3 of dopant.

Figure 4:
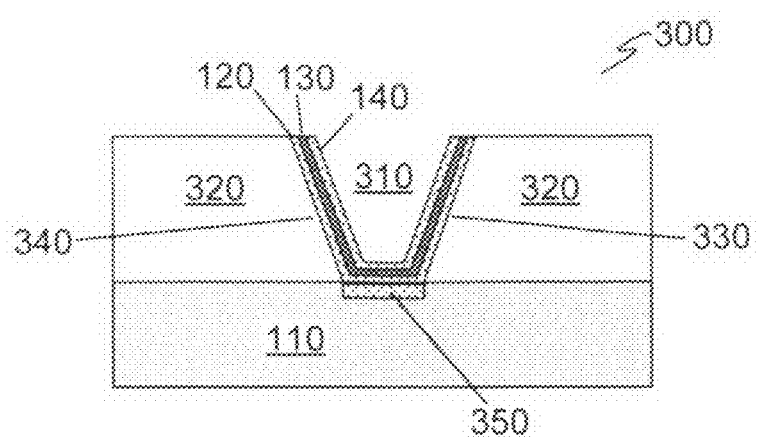
FIG. 4 illustrates the device in FIG. 3 after removing the metal and two semiconductor layers from the upper surface of a field layer.

FIG. 4 illustrates the TCN 300 in FIG. 3 after eroding and/or etching the base layer 120, conductive layer 130, and top layer 140 from the upper surface 325 of the field layer 320 of FIG. 3. Erosion and/or etching of the base layer 120, conductive layer 130, and top layer 140 of FIG. 3 may be performed using a lithographic and etch technique that masks the opening 310 and the base layer 120, conductive layer 130, and top layer 140 in the opening 310 to selectively remove the base layer 120, conductive layer 130, and top layer 140 from the upper surface 325 of FIG. 3 without eroding a significant portion of the field layer 320. Alternately, a chemical mechanical polish (CMP) technique is used to remove the base layer 120, conductive layer 130, and top layer 140 from the upper surface 325 of FIG. 3.

Figure 5:
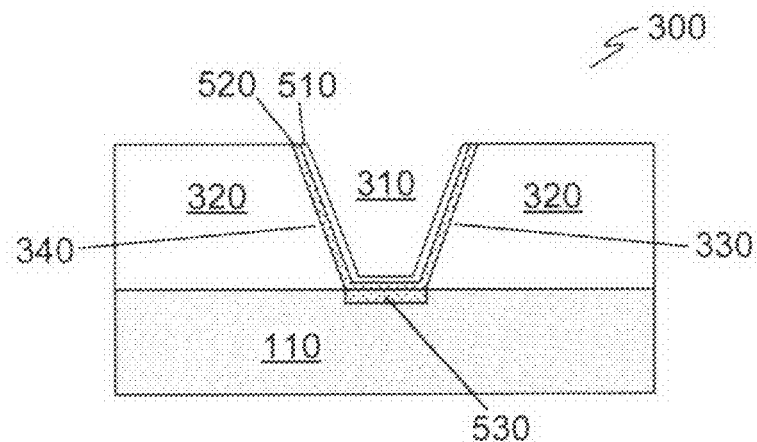
FIG. 5 illustrates the device in FIG. 4 after exposing the device to a thermal treatment process to form silicide on an interface layer.

FIG. 5 illustrates the TCN 300 of FIG. 4 after thermally treating and/or annealing the TCN 300 to form a silicide 510, an interface 520, and a contact 530. In one embodiment, the conductive layer 130 is annealed at a temperature that is greater than or approximately equal to 300 degrees Celsius (° C.) and is less than or approximately equal to 650° C. The anneal process may be a spike anneal with no soak time. Alternately, the anneal process may last for a time period that ranges from milliseconds up to five minutes. In other implementations where titanium, cobalt, or platinum is used, the annealing process forms titanium silicide layers, cobalt silicide layers, or platinum silicide layers.

Unlike conventional silicide layers, here the silicide 510 and the interface 520 cover the contact 530 and at least a portion of the sidewall 330 and/or the sidewall 340. Because the deposited conductive layer 130 is confined within the contact trenches, the formation of each silicide layer extends along a surface of each contact trench. Accordingly, the surface area that is covered by the silicide 510 and interface 520 expands along a surface area (in and out of the paper of FIG. 5) of the contact 530 and the sidewall 330 and/or the sidewall 340. Furthermore, the interface 520 may at least partially diffuse into selected portions of the contact 530. A minimum thickness of the interface 520 may be approximately 50 Å. The thickness of the interface 520 is selectively designed based on an amount of current to be passed by the interface 520 as a function of applied voltage and resistances in the circuit, a doping level of the interface 520, width of the trench or diameter of the via when viewed from the top, etc. Formation of the silicide 510 and interface 520, at least a portion of the interface 520 directly adjacent to the contact 530, creates an enhanced contact to a conductor 610 illustrated in FIG. 6.

Figure 6:
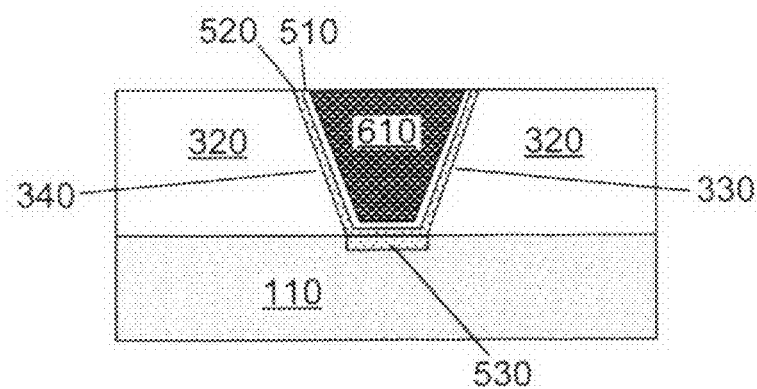
FIG. 6 illustrates the device of FIG. 5 after forming a conductor on the silicide.

FIG. 6 illustrates the TCN 300 of FIG. 5 after forming the conductor 610 on the silicide 510. In another embodiment (not shown), the conductor 610 is formed directly adjacent to a portion of the first sidewall 330 and/or the second sidewall 340 and formed directly adjacent to the silicide 510. In this embodiment, the silicide 510 is formed on the first sidewall 330 and the second sidewall 340. After the silicide 510 is formed, a metallization process may be carried out to fill the remainder of the opening 310 with metal that functions as an electrical contact to the silicide 510 and the contact 530. In some implementations, the metal used to fill the contact trenches may be tungsten. In other implementations, metals that may be used to form the electrical contact include, but are not limited to, copper, ruthenium, palladium, platinum, cobalt, nickel, ruthenium oxide, tungsten, aluminum, titanium, tantalum, titanium nitride, tantalum nitride, hafnium, zirconium, a metal carbide, and a conductive metal oxide. Conventional metal deposition processes such as sputtering, PVD, CVD, ALD, electroless plating, or electroplating may be used to deposit metal into the contact trenches. The metallization process may be followed by a CMP process to remove any excess metal and confine the metal deposition to the conductor 610.

Figure 7:
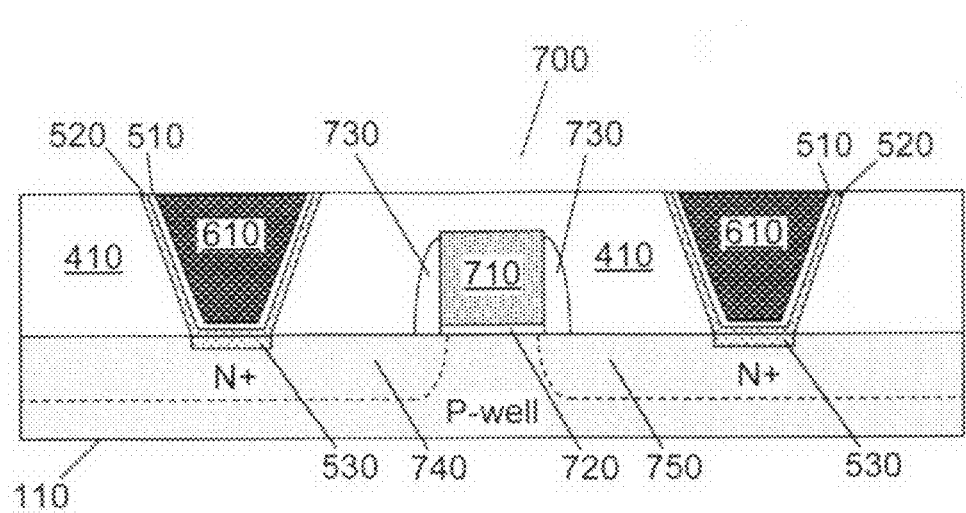
FIG. 7 illustrates a device comprising a silicide formed using a sandwiched metal structure for enhanced contacts.

FIG. 7 illustrates an embodiment of a thermally treated sandwiched metal stack 100 to form a silicide 510 and interface 520 on a contact 530 adjacent to a transistor 700 that includes a gate electrode 710, a gate oxide 720, spacers 730, a source region 740, and a drain region 750. The transistor 700 is formed on a substrate 110, such as a semiconductor wafer. As shown, a region below the transistor 700 may be P-doped and the source and drain regions may be N-doped. Alternately, the region below the transistor 700 may be N-doped and the source and drain regions may be P-doped.

The gate oxide 720 is disposed between the spacers 730 and may be formed from silicon dioxide ($SiO_2$) that is thermally grown. The gate electrode 710 may be formed by depositing and patterning a layer of polysilicon. Conventional photolithography techniques may be used to pattern the polysilicon to form the gate electrode 710. Portions of the source region 740 and drain region 750 may be contact regions 350 of FIG. 3, formed by implanting dopants into regions of the substrate surface 110 that are adjacent to the spacers 730. Dopants that may be used to form the source and drain regions 740/750 are well known in the art. A high temperature annealing process may be used to activate the dopants to complete formation of the source and drain regions 740/750. The contact 530 may be formed on the source region 740, the drain region 750, and/or other regions on the substrate 110 (not shown).

Figure 8:
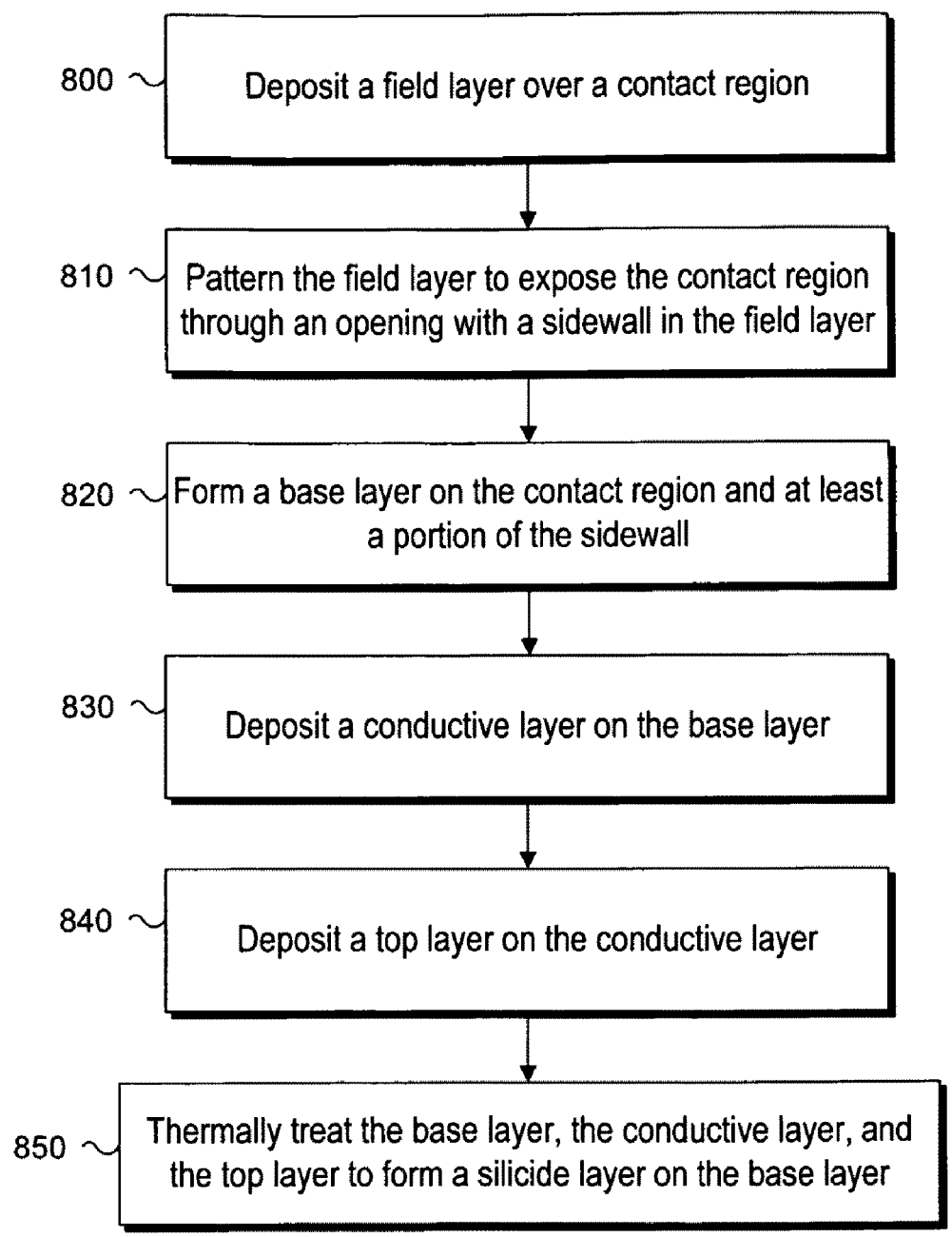
FIG. 8 is a flowchart describing one embodiment of a fabrication process used to form enhanced contacts through silicidation of a sandwiched metal structure.

FIG. 8 is a flowchart describing one embodiment of a fabrication process used to form an enhanced contact through silicidation of a sandwiched metal structure. A field layer 320 is deposited over a contact region 350 in element 800. The field layer 320 is patterned using a lithographic technique in element 810 to expose the contact region 350 through an opening in the field layer 320, the field layer 320 having at least one of a first sidewall 330 and second sidewall 340. A base layer 120 is formed on the contact region 350 and at least a portion of the first sidewall 330 in element 820. In element 830, a conductive layer 130 is deposited on the base layer 830. A top layer 140 is deposited on the conductive layer 130 in element 840, and a silicide 510 is formed on the base layer 120 through thermal treatment of the base layer 120, conductive layer 130, and top layer 140 in element 850.

Additional process steps may be performed to complete the device, as will be appreciated by those of skill in the art.

A plurality of embodiments of an apparatus and methods for increasing an effective contact area of a contact have been described. The foregoing description of the embodiments of the invention has been presented for the purposes of illustration and description. It is not intended to be exhaustive or to limit the invention to the precise forms disclosed. This description and the claims following include terms, such as left, right, top, bottom, over, under, upper, lower, first, second, etc. that are used for descriptive purposes only and are not to be construed as limiting. For example, terms designating relative vertical position refer to a situation where a device side (or active surface) of a substrate or integrated circuit is the "top" surface of that substrate; the substrate may actually be in any orientation so that a "top" side of a substrate may be lower than the "bottom" side in a standard terrestrial frame of reference and still fall within the meaning of the term "top." The term "on" as used herein (including in the claims) does not indicate that a first layer "on" a second layer is directly on and in immediate contact with the second layer unless such is specifically stated; there may be a third layer or other structure between the first layer and the second layer on the first layer. The embodiments of a device or article described herein can be manufactured, used, or shipped in a number of positions and orientations.

However, one skilled in the relevant art will recognize that the various embodiments may be practiced without one or more of the specific details, or with other replacement and/or additional methods, materials, or components. In other instances, well-known structures, materials, or operations are not shown or described in detail to avoid obscuring aspects of various embodiments of the invention. Similarly, for purposes of explanation, specific numbers, materials, and configurations are set forth in order to provide a thorough understanding of the invention. Nevertheless, the invention may be practiced without specific details. Furthermore, it is understood that the various embodiments shown in the figures are illustrative representations and are not necessarily drawn to scale.

Reference throughout this specification to "one embodiment" or "an embodiment" means that a particular feature, structure, material, or characteristic described in connection with the embodiment is included in at least one embodiment of the invention, but do not denote that they are present in every embodiment. Thus, the appearances of the phrases "in one embodiment" or "in an embodiment" in various places throughout this specification are not necessarily referring to the same embodiment of the invention. Furthermore, the particular features, structures, materials, or characteristics may be combined in any suitable manner in one or more embodiments. Various additional layers and/or structures may be included and/or described features may be omitted in other embodiments.

Various operations will be described as multiple discrete operations in turn, in a manner that is most helpful in understanding the invention. However, the order of description should not be construed as to imply that these operations are necessarily order dependent. In particular, these operations need not be performed in the order of presentation. Operations described may be performed in a different order than the described embodiment. Various additional operations may be performed and/or described operations may be omitted in additional embodiments.

Persons skilled in the relevant art can appreciate that many modifications and variations are possible in light of the above teaching. Persons skilled in the art will recognize various equivalent combinations and substitutions for various components shown in the Figures. It is therefore intended that the scope of the invention be limited not by this detailed description, but rather by the claims appended hereto.

What is claimed is:

1. A method, comprising:
    depositing a field layer on a contact region;
    patterning the field layer to expose the contact region through an opening, the opening having a sidewall;
    forming a base layer on the contact region and at least a portion of the sidewall;
    depositing a conductive layer on the base layer;
    forming a top layer on the conductive layer; and
    thermally treating the base layer, the conductive layer, and the top layer to form a silicide on the base layer wherein at least a portion of the top layer and a portion of the base layer is consumed to form the silicide.

2. The method of claim 1, wherein the top layer is completely consumed to form the silicide.

3. The method of claim 1, wherein the silicide is formed using the thermal treatment in a temperature range approximately between 300 and 650 degrees Celsius.

4. The method of claim 1, wherein the base layer is a doped semiconducting layer.

5. The method of claim 1, wherein the opening is etched in the field layer to provide a plurality of angled sidewalls adjacent to the contact region.

6. The method of claim 1, further including forming a conductor on the silicide.

* * * * *